United States Patent [19]
Unkrich

[11] Patent Number: 5,206,889
[45] Date of Patent: Apr. 27, 1993

[54] TIMING INTERPOLATOR

[75] Inventor: Mark A. Unkrich, Redwood City, Calif.

[73] Assignee: Hewlett-Packard Company, Palo Alto, Calif.

[21] Appl. No.: 822,376

[22] Filed: Jan. 17, 1992

[51] Int. Cl.$^5$ .................................. H03K 5/135
[52] U.S. Cl. .............................. 377/20; 377/16; 331/1 A; 328/155; 375/106; 375/111; 307/606; 307/269
[58] Field of Search .............. 377/20, 16; 331/1 A; 328/155; 375/106, 111; 307/606, 269

[56] References Cited
U.S. PATENT DOCUMENTS

| | | | |
|---|---|---|---|
| 4,626,796 | 12/1986 | Elder | 328/155 |
| 4,719,365 | 1/1988 | Misono | 328/155 |
| 4,876,518 | 10/1989 | Perkins | 331/1 A |
| 5,101,117 | 3/1992 | Johnson et al. | 307/269 |
| 5,111,151 | 5/1992 | Ii | 328/155 |

Primary Examiner—William L. Sikes
Assistant Examiner—Scott A. Ouellette

[57] ABSTRACT

A timing interpolator providing high resolution timing measurement of when an event occurs. The interpolator of the present invention includes three embodiments. The interpolator of the first embodiment includes a Voltage Controlled Oscillator (VCO) phase-locked loop, an N-bit counter, and an N-bit latch. The interpolator of the second embodiment includes a delay line phase-lock loop and an X-bit latch. The delay line phase-lock loop includes an X-bit delay cell chain and a phase detector. The interpolator of the third embodiment of the present invention represents a combination of the interpolators of the first and second embodiments. The interpolator of the third embodiment includes a VCO phase-locked loop, a delay line phase-lock loop and X-bit latches.

18 Claims, 10 Drawing Sheets

PHASES OF DELAY CHAIN

TIMING INTERPOLATOR

BACKGROUND OF THE INVENTION

1. Field of the Invention

The present invention relates to systems and methods for digital time interpolation. More particularly, the present invention relates to systems and methods for employing phase-locked loop timing interpolation techniques to provide high timing resolution of when an event signal occurs.

2. Related Art

Many devices depend on measuring the timing of an event signal. Such devices typically use a reference signal to latch the state of an unknown event signal to detect when and if the event signal occurred. The reference signal, as a known reference point, is then interpolated by the event signal. Thus, an estimated time value between the reference signal and the point at which the event signal is latched can be calculated.

Two application areas requiring event timing are laser interferometers and frequency counters.

Laser interferometers require event timing in order to perform displacement measurements. However, conventional displacement measurements of laser interferometers are limited by the resolution of timing measurements of the interference patterns from the measurement and reference receivers. In other words, the displacement measurement resolution is limited by the accuracy of measuring the phase of the interference pattern of a Doppler shifted split frequency laser light at the measurement and reference receivers.

Frequency counters also use interpolation techniques to determine event timing. The interpolator resolution limits the performance of the counter, for example, when time interval measurements are being made on the input signal.

Conventional interpolation techniques are limited in resolution by the smallest possible period reference signal that can be accurately used. Yet, in many instrument applications, the critical measurement is the timing of an event. Thus, there is a need for a device that can accurately increase resolution beyond current limitations on the reference signal period.

SUMMARY OF THE INVENTION

The present invention is directed to an interpolator for providing high resolution timing measurement of when an event occurs. The present invention includes three embodiments.

According to the first embodiment of the present invention, the interpolator includes a voltage controlled oscillator (VCO) phase-locked loop, an N-bit counter, and an N-bit latch. The phase-locked loop produces a high frequency signal which is phase-locked to a low frequency reference clock. The N-bit counter counts edges of the high frequency signal to produce a count value. The N-bit latch latches the count value from the N-bit counter upon receiving the event. The count value represents an interpolated timing value of when the event occurred, relative to the low frequency reference signal.

According to the second embodiment of the present invention, the interpolator includes a delay line phase-lock loop and an X-bit latch, where X is an integer representing the number of cascaded variable delay elements. The delay line phase-lock loop phase locks a high frequency reference signal with a delayed high frequency signal. The delay line phase-lock loop also generates X phases of delayed signals from the high frequency signal. The X-bit latch latches the value of each phase of the high frequency signal upon receiving the event. The X-bit latched data is decoded to determine the interpolated timing value of when the event occurred relative to the high frequency reference signal.

The interpolator of the third embodiment of the present invention represents a combination of the interpolators of the first and second embodiments. The interpolator of the third embodiment includes a voltage controlled oscillator (VCO) phase-locked loop, an N-bit counter, a delay line phase-lock loop, and N-bit and X-bit latches. The VCO phase-locked loop produces a high frequency signal phase-locked to a low frequency signal. The delay line loop generates X phases of delayed signals from the high frequency signal and phase locks the high frequency signal with the delayed high frequency signal. Upon receiving the event signal, the N-bit latch latches the value of the N-bit counter and the X-bit latch latches the states of the X phases of the high frequency signal from the delay chain of cells in the delay line phase-lock loop. The X-bit data is decoded and combined with the N-bit latched data to provide the interpolated value of when the event occurred relative to the low frequency reference signal.

FEATURES AND ADVANTAGES OF THE INVENTION

One feature of this invention is to provide a high resolution measurement of when an event occurs relative to a reference signal or clock signal. The invention interpolates the clock period to provide higher resolution information about when the event occurred during the clock period.

Another feature of this invention is to provide a bipolar monolithic implementation of an interpolator to improve resolution and slew rate of laser interferometer systems by a factor of 16 over current systems.

Added benefits are also realized in the area of frequency counters. The present invention replaces interpolator boards in frequency counters that use numerous high power bipolar flip-flops, delay lines, and production adjustments.

Further features and advantages of the present invention, as well as the structure and operation of various embodiments of the present invention, are described in detail below with reference to the accompanying drawings. In the drawings, like reference numbers indicate identical or functionally similar elements. Additionally, the left-most digit of a reference number identifies the drawing in which the reference number first appears.

BRIEF DESCRIPTION OF THE DRAWINGS

The present invention will be described with reference to the accompanying drawings, wherein.

DETAILED DESCRIPTION OF THE PREFERRED EMBODIMENTS

1. Overview

The present invention is directed to a system and method for providing high resolution timing measurement of when an event occurs. The present invention includes three embodiments. The first embodiment is directed to a voltage controlled oscillator (VCO) phase-locked loop interpolation system and method. The second embodiment is directed to a delay line phase-locked loop interpolation system and method. The third embodiment represents a combination of the first two embodiments. These embodiments of the present invention are discussed in the following sections.

2. VCO Phase-Locked Loop Interpolation

Figure 1:
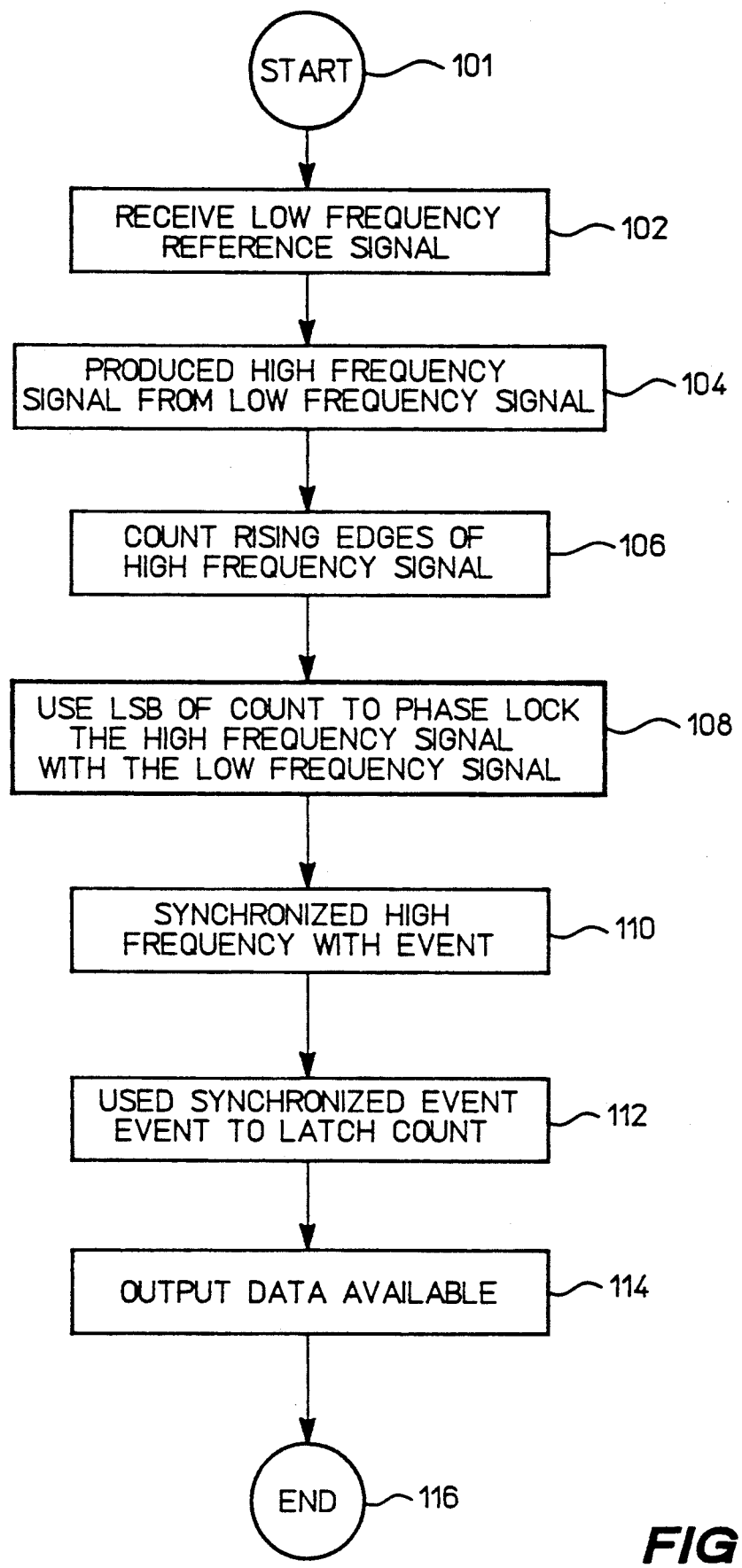
FIG. 1 is a flow chart of an interpolator in accordance with a first embodiment of the present invention.
Figure 2:
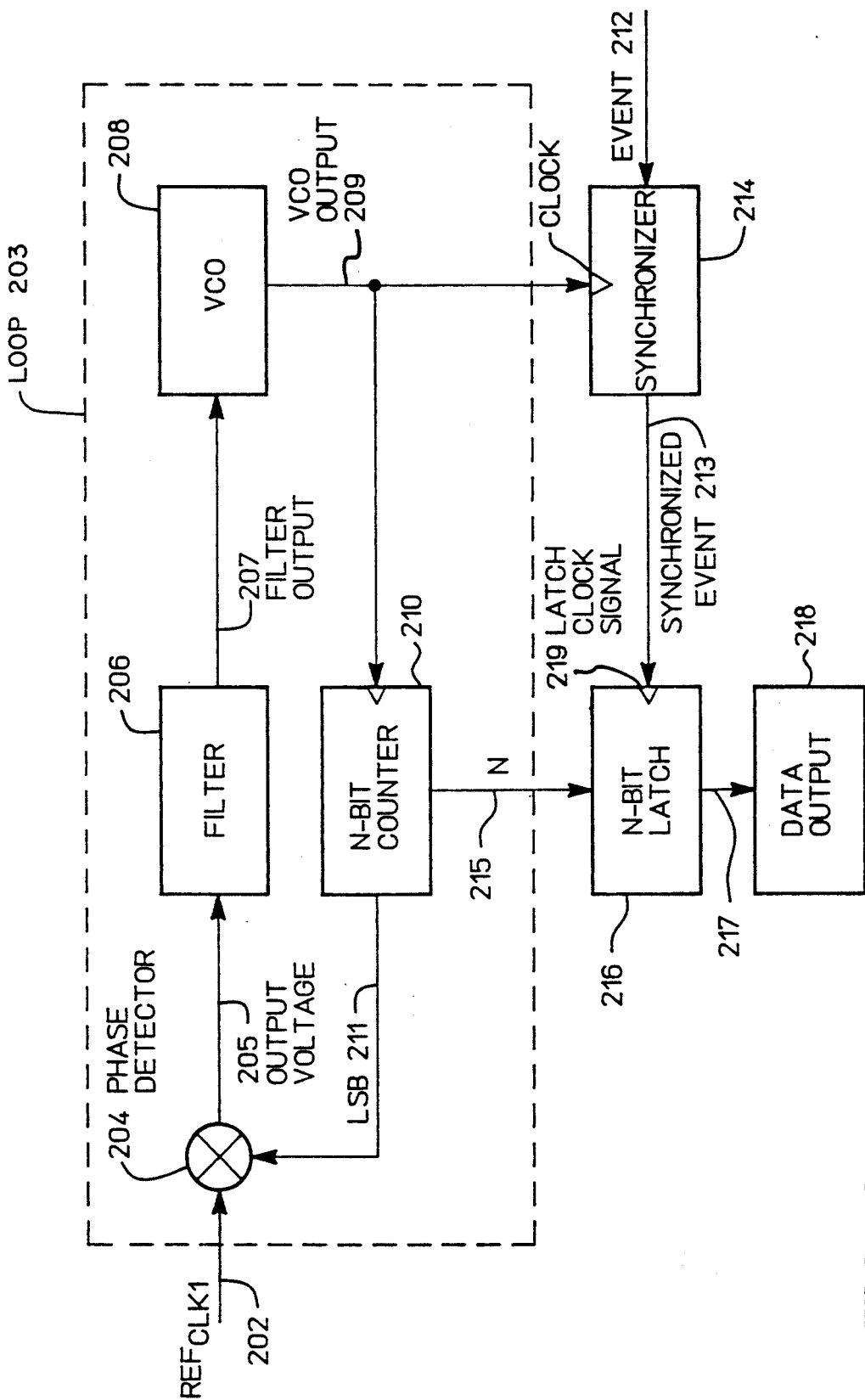
FIG. 2 illustrates a high level block diagram of an interpolator according to the first embodiment of the present invention.

FIG. 2 illustrates a block diagram of an interpolator 201 according to a first embodiment of the present invention. The operation of the interpolator 201 is generally illustrated in the flowchart shown in FIG. 1.

As illustrated in FIG. 2, the interpolator 201 includes a reference clock signal 202 (Refclk1), a phase detector 204, a filter 206, a voltage controlled oscillator (VCO) 208 with a high frequency clock output 209, an N-bit counter 210 with a least significant bit (LSB) 211 as an output, a synchronizer 214, and an N-bit latch 216. The structure and operation of these elements are well known to those skilled in the art.

Referring now to FIG. 1, in step 102 the interpolator 201 receives a low frequency reference signal 202. In step 104, the interpolator 201 produces a high frequency signal 209 from the low frequency reference signal 202. In step 106, the interpolator 201 counts the periods of the high frequency signal 209. In step 108, the interpolator 201 uses a least significant bit 211 (LSB) of the count from step 106 to phase-lock the high frequency signal 209 with the reference signal 202. In step 110, the interpolator 201 synchronizes an event signal 212 with the phased-locked high frequency signal 209. In step 112, the interpolator 201 latches the current count (from step 106) upon receiving the synchronized event signal 213. The latched count represents the interpolated timing value for the event signal 212.

The phase detector 204, the filter 206, the VCO 208, and the N-bit counter 210 define a phase-locked loop 203.

The interpolator 201 will now be described in greater detail. Referring to FIG. 2, the phase detector 204 receives the Refclk1 202. Preferably, the Refclk1 202 is a square wave. However, the Refclk1 202 may be implemented using other wave forms having discernable edges at periodic frequencies.

The phase detector 204 delivers an output voltage 205 to the filter 206. The output voltage 205 is proportional to the difference in phase between the Refclk1 202 and that of the LSB 211. The output voltage 205 of the phase detector 204 is employed as an error signal to keep the high frequency clock output 209 of the VCO 208 phasesynchronized with the Refclk 202.

The filter 206 provides desired stability, dynamics, and noise characteristics for the loop 203. An output 207 of filter 206 in turn controls the VCO 208. Specifically, the VCO 208 generates the high frequency clock output 209 proportional to the filter output 207. The high frequency clock output 209 of the VCO 208 will vary depending on the frequency of the Refclk1 202.

The high frequency clock output 209 of the VCO 208 is received by the N-bit counter 210. The N-bit counter 210 counts the periods of the high frequency clock output 209 to produce an N-bit count. The N-bit counter 210 then generates a LSB 211 of the count by dividing the high frequency clock output 209 by $2^N$. The LSB 211 is used as the other input to the phase detector 204.

The phase-lock loop 203 lines up the edges of the Refclk1 202 with the LSB 211 from the N-bit counter 210. When the phase-lock loop 203 is locked, the LSB 211 of the N-bit counter 210 is the same frequency and phase as the Refclk1 202. The output voltage 205 is now an error signal representing the difference in phase between Refclk1 202 and LSB signal 211 (as previously discussed).

The high frequency clock output 209, of the VCO 208, is also used as a clock input for the synchronizer 214. The synchronizer 214 synchronizes the high frequency clock output 209 with the event 212. The event signal 212, is asynchronous to the high frequency clock output 209. Thus, the event signal 212 may cause an indeterminant metastable state in an output 217 of the N-bit latch 216. The synchronizer 214 generates a synchronized event signal 213, which is a synchronized representation of the event 212. The synchronizer 214 is necessary since, as noted above, the event 212 occurs asynchronously.

The synchronized event signal 213 becomes a latch clock signal 219 passed to the N-bit latch 216. The count in the counter 210 is driven to the N-bit latch 216 by the synchronized signal 213. The data latched from the N-bit counter 210 represents an interpolated value. The value is equal to 1 to $2^N$ possible states during each Refclk1 202 period. Thus an improvement of a factor of $2^N$ in resolution is achieved by the present invention.

Interpolation of a VCO Phase-Locked Loop Interpolator 201 is limited by the output frequency capability of the VCO 208 and maximum clocking frequency of the N-bit Counter 210. Higher resolution can be achieved by using a delay line phase-locked interpolator, as described below.

3. Delay Line Phase-Locked Loop Interpolation

Figure 3:
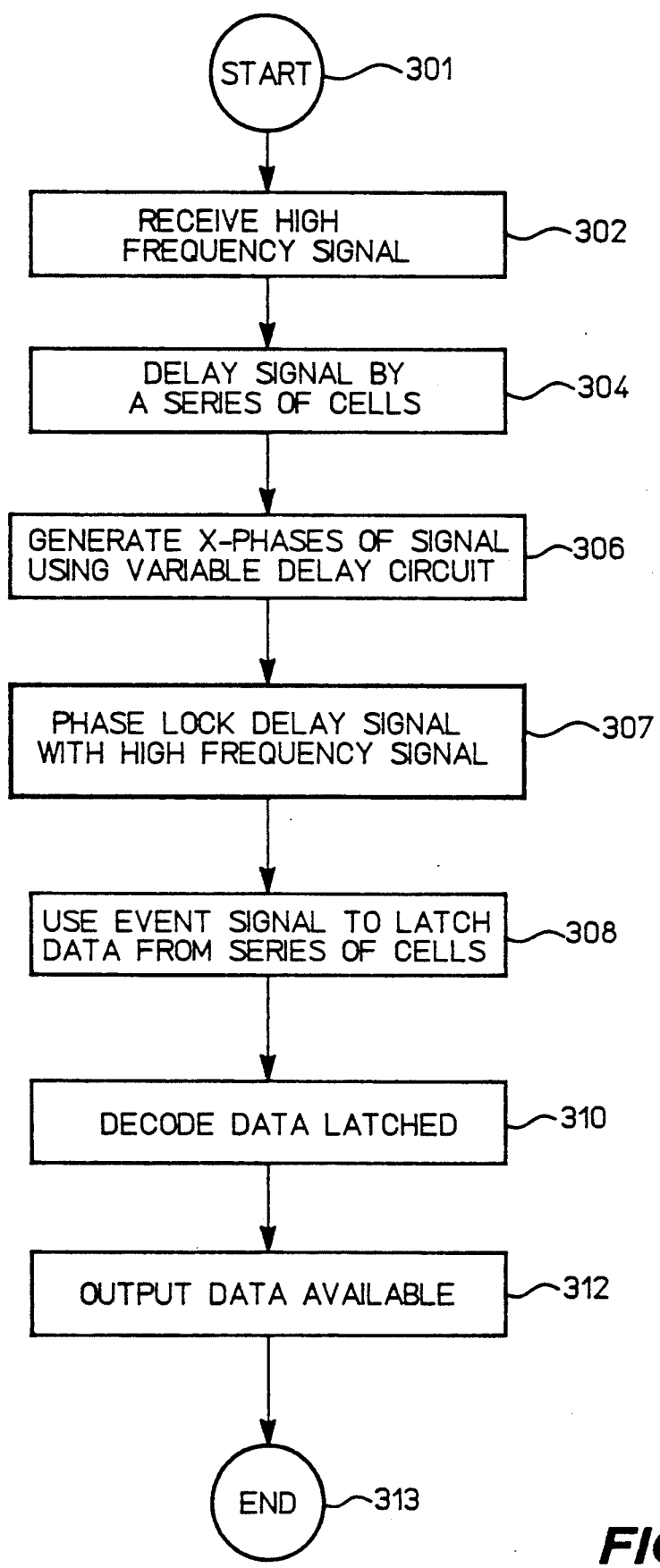
FIG. 3 is a flow chart that illustrates an overview of how a delay line phased-locked interpolator functions, in accordance with a second embodiment of the present invention.
Figure 4:
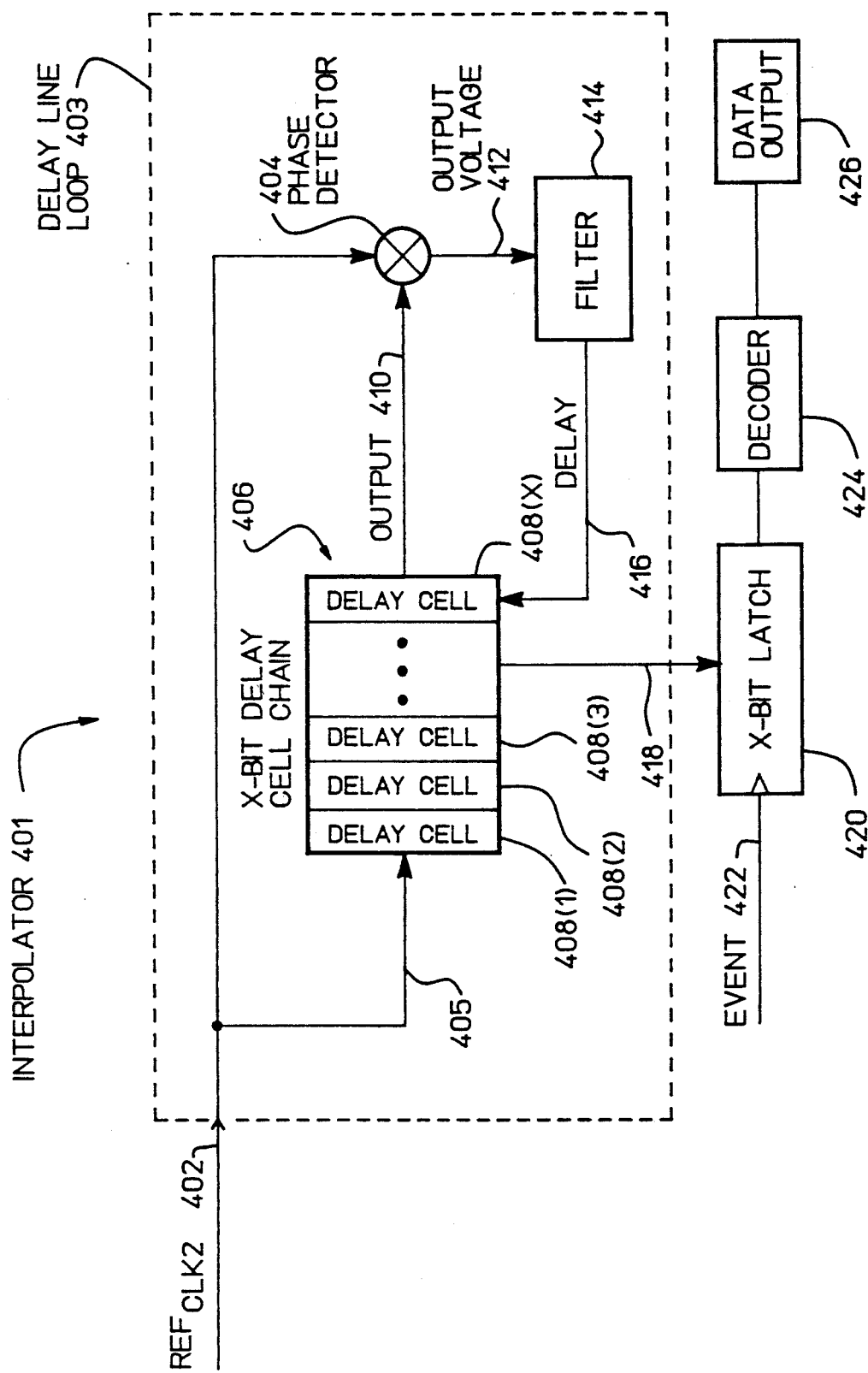
FIG. 4 illustrates a high level block diagram of the interpolator according to the second embodiment of the present invention.

FIG. 4 illustrates a block diagram of an interpolator 401 according to a second embodiment of the present invention. The operation of the interpolator 401 is generally illustrated in the flowchart shown in FIG. 3.

As shown in FIG. 4, the interpolator 401 includes a delay line phase-lock loop 403. The delay line phase-lock loop 403 has a reference clock signal (Refclk2) 402, a phase detector 404, an X-bit delay cell chain 406 having X delay cells 408(1), 408(2), . . . , 408(X) and a filter 414. The interpolator 401 also has an X-bit latch 420, a decoder 424, and a data output 426.

Referring now to FIG. 3, in step 302 the interpolator 401 receives a high frequency reference signal (Refclk2) 402. In step 304, the interpolator 401 delays the Refclk2 402 in a X-bit delay cell chain 406. In step 306, the interpolator 401 generates X-phases of the Refclk2 402 by passing the Refclk2 402 through the X-bit delay cell chain 406. In step 307, the interpolator 401 phase locks the X-bit delay cell chain output 410 with the Refclk 402. In step 308, data from the X-bit delay cell chain is then latched by an event signal 422. In step 310 the data is decoded via a decoder 420. In step 312 the data is transferred to a data output 426 available for computation.

The interpolator 401 will now be described in greater detail.

Referring to FIG. 4, the phase detector 404 receives the Refclk2 402. Preferably, the Refclk2 402 is a square wave. However, the Refclk2 402 may be implemented using other wave forms, which have discernable edges at periodic frequencies.

The Refclk2 402 is also connected as an input 405 to a cascade of X delay cells 408 of the X-bit delay cell chain 406. The X-bit delay cell chain 406 introduces a lag time in the Refclk 402. The lag time is equal to the time that it takes for the Refclk2 402 to pass through the delay cells 408 of the X-bit delay cell chain 406. Only the phase of the Refclk2 402 signal is modified and not the frequency of the Refclk2. This generates X-phases of data output 418 from the X-bit delay cell chain 406 of the Refclk2 402. Specifically, each delay cell 408 introduces a phase delay in the Refclk2 402.

Thereafter, the Refclk2 402 and the output 410 of the X-bit delay cell chain 406 are phase detected by means of the phase detector 404. The phase detector 404 delivers an output 412 whose voltage is proportional to the difference in phase between Refclk2 402 and the output 410 of the X-bit delay cell chain 406. The output 412 is passed through the filter 414 to achieve the desired stability, dynamics, and noise characteristics of the loop 403. The output of the filter 414, Delay signal 416, acts as a control for the delay of each of the delay cells 408. Specifically, the delay signal controls how long it takes the Refclk2 402 to go through each cell 408.

When the loop 403 is locked, the input 405 and output 410 of the X-bit delay cell chain 406 are in phase. The loop 403 can achieve lock when the delay of each cell 408 is equal to the period of the Refclk2 402 divided by X, the number of cells 408, times any integer multiple Y. Y refers to a mode, which is further described below.

In order to efficiently use the information in all of the cells 408, the integer multiple Y must be odd if X is even. Under these conditions, outputs of the delay cells 408 generate an X-phase clock, i.e., all cells have different phase and are evenly distributed across the period of the Refclk2 402. Therefore, X is the number of unique X phases of data 418 created of the Refclk2 signal 402 if Y (a mode to be described) is an odd integer when X is even. The X phases 418 are evenly distributed across the period of Refclk2 402.

The X-bit delay cell chain data output 418 of the X phases of the X-bit delay cell chain 406 is latched by the X-bit latch 420. Latching is driven by the event signal 422. The data 418 latched from the X-bit delay cell chain 406 has X possible states for each phase Refclk2 402. Specifically, the information about when the event 422 latches the data is stored by the X-bit latch 420. X unique possible states can be resolved when decoding the data with the decoder 424.

Figure 9:
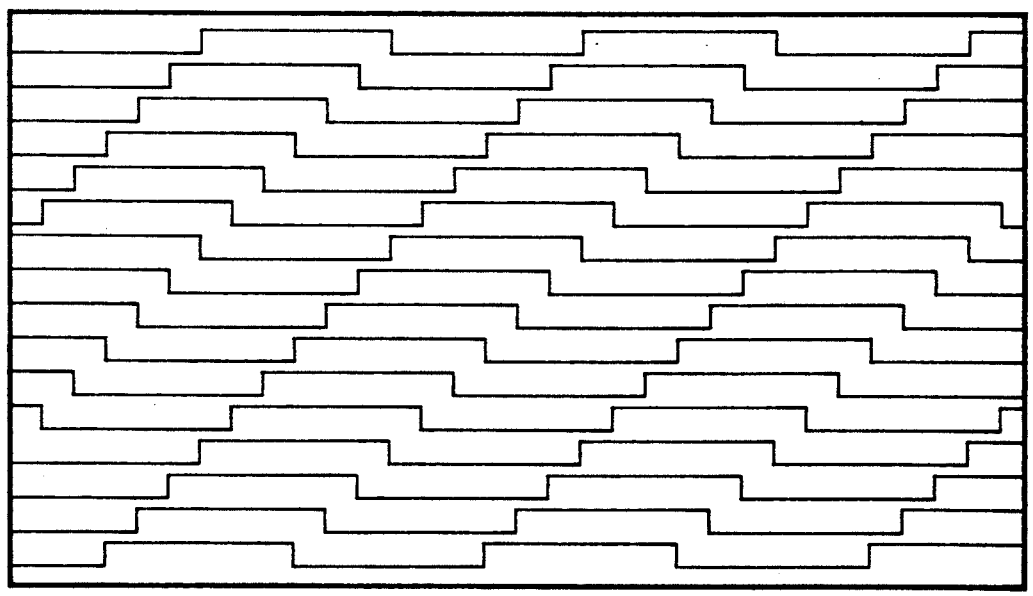
FIG. 9 illustrates one mode of a 16 phase clock of the present invention.

FIG. 9 shows one possible state of the X-bit latch 420 for $X=16$ and $Y=1$ as a function of time. When the data 418 is latched, the state of the X phases is stored. Depending on the mode Y of the phase-lock loop implemented, the decoder 424 must allow for the corresponding interleave of the X phases of data 418 of the Refclk2 402. This yields a factor of X improvement in resolution when the latched clock phases are then passed to a decoder 424.

Both edges of the clock Refclk2 402 can be used as reference edges by using a clock with a controlled duty cycle such that the difference in the time of the two states of the clock differ by the time of the period of Refclk2 402 divided by X. Maintaining this duty cycle in the delay chain of the phase lock loop, a 2*X phase clock is effectively created using the phase outputs 418 and their complements of the delay cells 408. A decoded output 426 of the X-bit latch 420 will yield a factor of 2*X improvement in resolution.

4. Using Both Interpolator Methods in Combination

Figure 5:
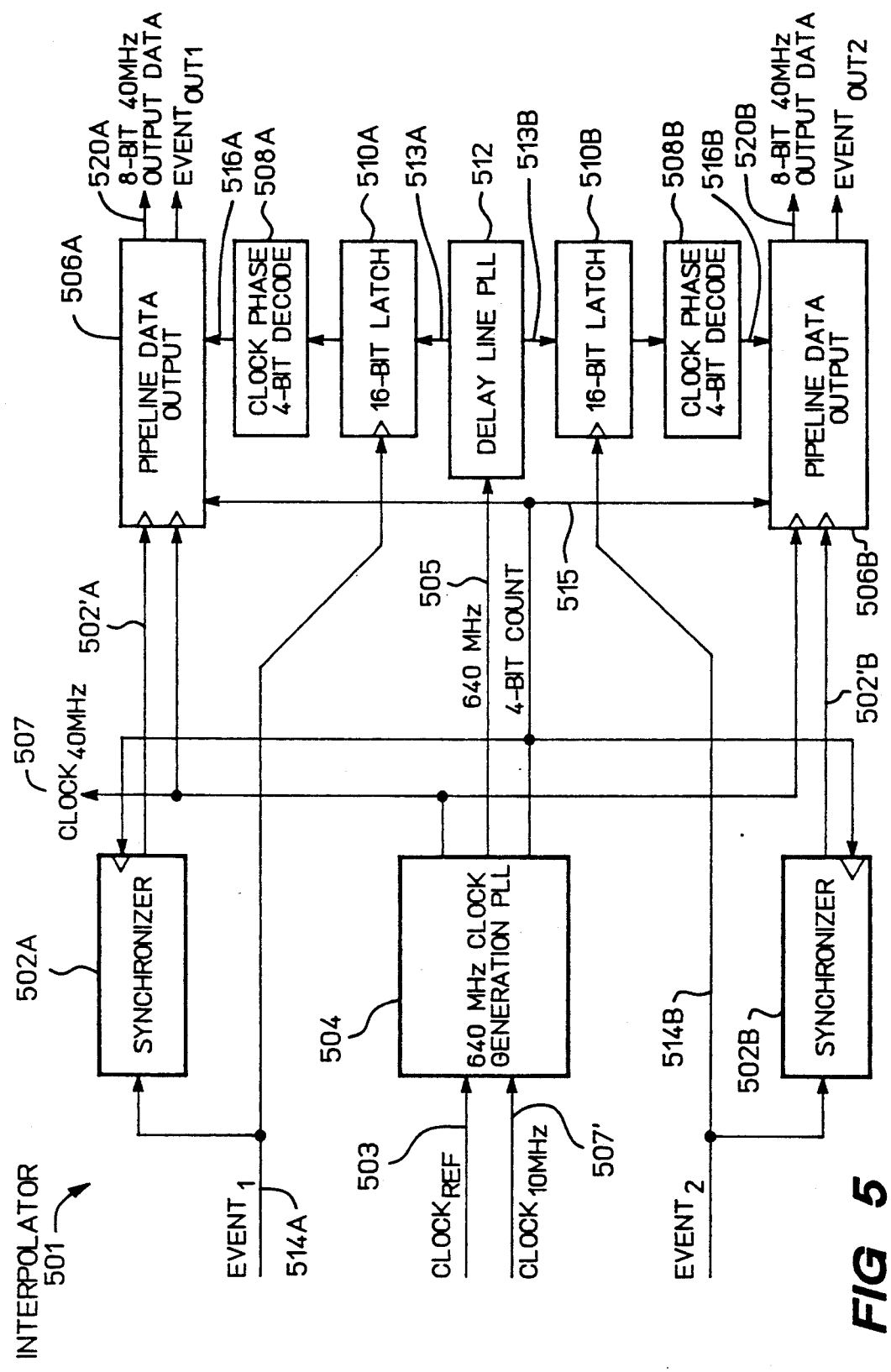
FIG. 5 illustrates a block diagram of the present invention according to a third embodiment of the present invention.

FIG. 5 illustrates a block diagram of an interpolator 501 according to a third embodiment of the present invention. The interpolator 501 represents a combination of the first embodiment of the present invention (shown in FIG. 2) and the second embodiment of the present invention (shown in FIG. 4).

The interpolator 501 includes synchronizers 502, clock generation phase-lock loop (PLL) 504, pipeline data outputs 506, decoders 508, latches 510, and a delay line PLL 512. The clock generation PLL 504 is similar to the phase-lock loop 203 of the first embodiment. The synchronizers 502 are similar to the synchronizer 214 of the first embodiment. The N-bit latch 216 of the first embodiment is part of the pipeline data outputs 506. The latches 510 are similar to the x-bit latch 420 of the second embodiment. The delay line PLL 512 is similar to the delay line phase-lock loop 403 of the second embodiment.

Generally, interpolation in this third embodiment involves taking a VCO high frequency clock output 505 (which corresponds to the VCO output 209 of the first embodiment) and utilizing it as the delay line phase-lock loop input reference clock (which corresponds to Refclk2 402 of the delay chain phase-lock loop of the second embodiment).

The overall resolution of the system is improved by a factor of $2^N*X$. N in the preferred embodiment of FIG. 5 is 6 where $2^N=2^6=64$ which is the ratio between the clock$_{ref}$ 503 and the 640 MHz clock 505. X in FIG. 5 is 16 which is the number of delay cells in the delay line PLL 512 whose output are latched by the 16-bit latch 510. With duty cycle control of the clock output of the VCO internal to PLL, described in FIG. 2, to allow using both edges as references, the overall resolution is improved by $2^{N+1}*X$.

An external 10 MHz reference clock 507' is input to the high frequency clock generation phase-lock loop 504 (PLL). The PLL 504 generates a high frequency clock 505. In the preferred embodiment of the present invention, a 640 MHz clock 505 is utilized. The high frequency clock 505 is divided down internally by a 4-bit synchronous counter to provide 4 bits or 16 possible states of the counter when the data is latched. This creates the 4 MSB's of interpolation of the output 40 MHz clock 507. Externally, the 40 MHz clock 507 is divided by 4 to create the 10 MHz reference clock 507' input which is phase locked to Clock$_{ref}$ 503. The two bits of the divide by 4 are latched externally (not shown) for an interpolated output.

The high frequency 640 MHz clock 505 drives the input of a delay line PLL 512. The output 513 of the delay line PLL 512 is phase-locked to the input resulting in 16 clock phases at 640 MHz each with approximately 100 psec resolution.

The input signal, Event$_1$, 514A or Event$_2$, 514B, latches the state of the 16 phase clock in the 16-bit latches 508A and 508B, respectively. A representation of the clock output is discussed below and the schematic is shown in FIG. 9. The clock phase is decoded by the decoder 508 to generate a 4-bit output 516 which corresponds to the interpolation of the period of the 640 MHz clock 505. This is relative to a 40 MHz output clock 507 which provides 4 least significant bit's (LSB's) of an output 8-bit data 520A and 520B.

The signals of Event1, 514A, and Event2, 514B, are also input to 7-stage synchronizers 502A and 502B, respectively; each clocked at 640 MHz. The outputs 502' from synchronizers 502A and 502B are used to latch the state of the 4-bit counter 515 from the clock generation PLL 504. Finally, the 8-bit 40 MHz data is pipelined via the pipeline data output 506A and 506B yielding the 8-bit 40 MHz output data 520A and 520B. This allows continuous operation of the interpolator 501 at a maximum event rate of 40 MHz.

External to the chip are the loop filters for the phase-lock loops to allow flexible control over the loop dynamics. Such filters are well known to those skilled in the art.

The structure and operation of the interpolator 501 are described in greater detail below.

4.1. VCO PLL High Frequency Clock Generation

The clock generation PLL 504 is described in detail in this section.

Figure 6:
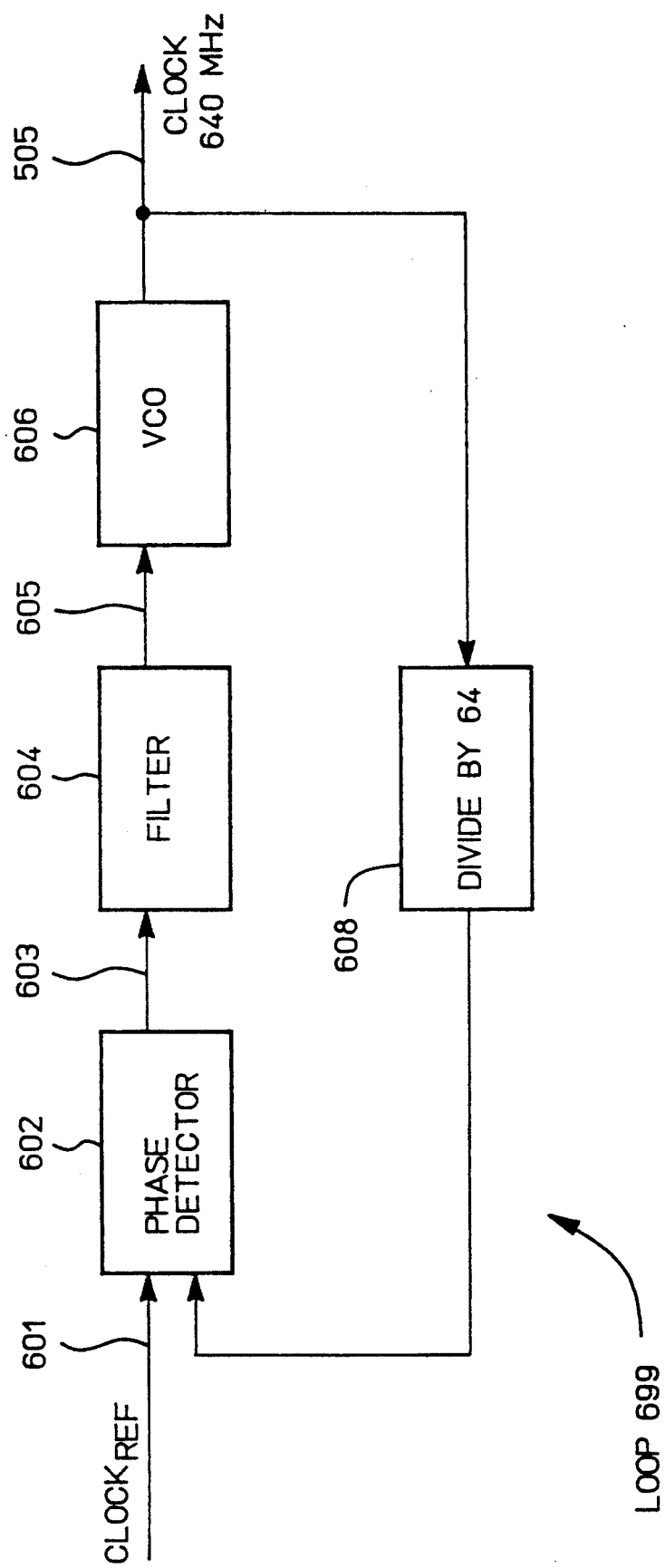
FIG. 6 illustrates a detailed block diagram of a phase-locked loop generator of the present invention.

The high frequency 640 MHz clock 505 is generated from an external 10 MHz reference clock 507' with the PLL 504. FIG. 6 is a block diagram representation of the PLL 504. The PLL includes four functional elements: phase/frequency detector (PD) 602, filter 604, a voltage controlled oscillator 606, and divider (1/64) 608. All are located within the chip of the PLL 504 of FIG. 5, except the filter 604 and two LSBs of the divider 608, which in this embodiment is connected externally. The least significant external bit is used as an input generated reference clock 503. According to the present invention the loop is narrow banded to decrease circuit and coupled noise contributing to jitter. Fully differential circuitry is used to minimize jitter.

The phase-lock loop for generation of the high frequency clock 505 includes a number of other elements. The divide by 64 block 608 of FIG. 4 is implemented as a 4-bit synchronous counter on the chip which outputs a 40 MHz clock.

The 10 MHz reference 507' and generated clock 503 are used as inputs to the phase detector 602. The output of the phase detector 603 has an average output 603, which is proportional to the phase difference between the two clocks 505 and 507' up to ±2π radians.

The loop dynamics for the phase detector 602, VCO 606, and divider 608 are determined by an integrator of the VCO 606. The filter 604 is used to filter the phase detector 602 output and maintain stability of the loop 699.

4.2. Voltage Controlled Oscillator

Figure 7:
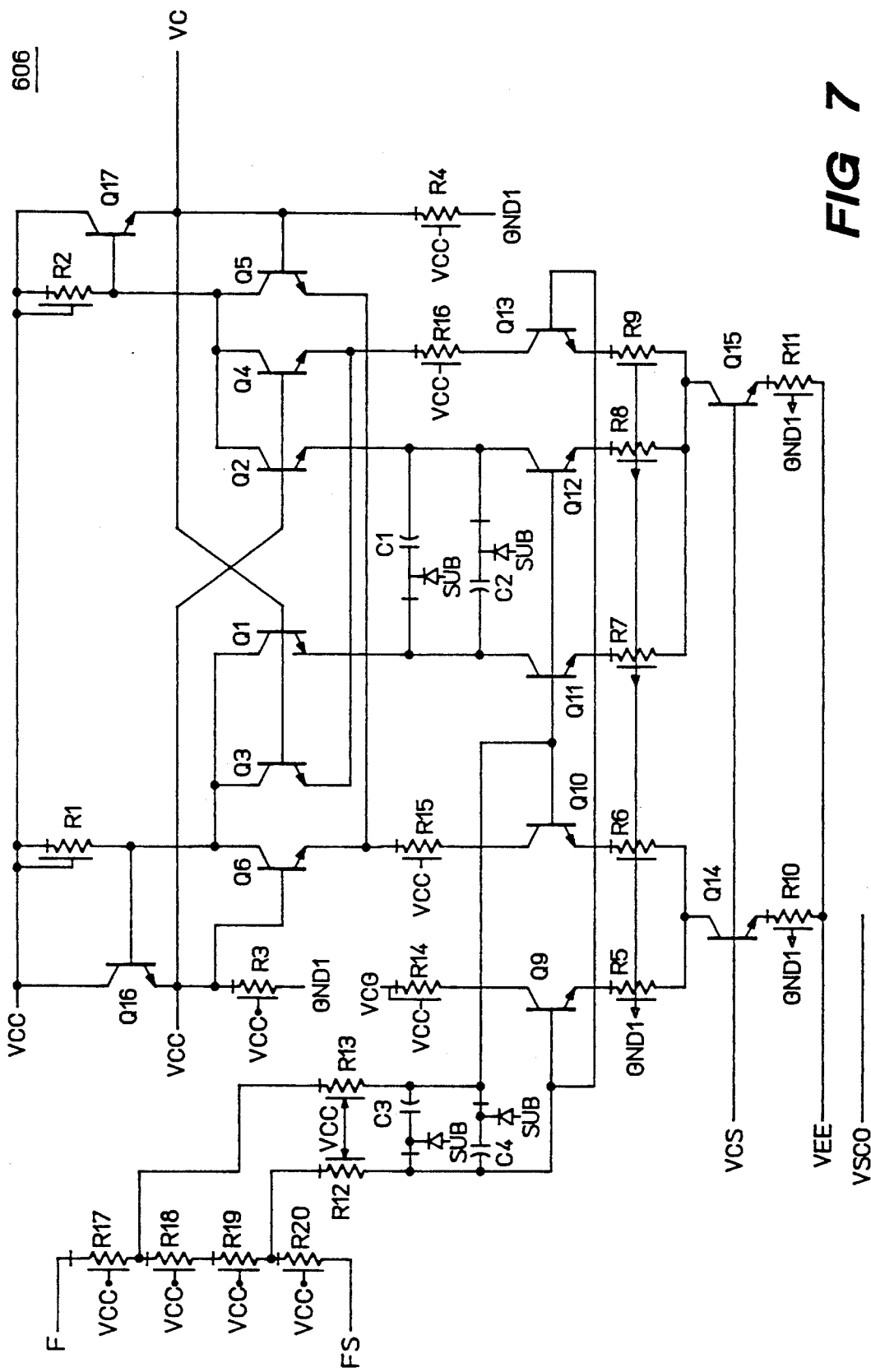
FIG. 7 illustrates a circuit diagram of a voltage controlled oscillator of the present invention.

FIG. 7 is a circuit diagram of VCO 606. The VCO 606 is an emitter coupled multi-vibrator with control circuitry to increase and decrease the frequency of oscillation. The first order model for the operating frequency is FREQ=Ich/(4×Ct×VL) where Ich is the charging current on the timing capicitor Ct, a timing capacitor value for C1 and C2, and VL is the voltage swing of one output Vo or VoB.

The VCO 606 includes an increase circuit and a decrease circuit. The increase circuit includes transistors Q5, Q6, Q9, Q10, Q14 and resistors R5, R6, R10. The decrease circuit includes transistors Q3, Q4, Q11-Q13, Q15 and resistors R7, R8, R9, R11. The decrease circuit is identical to the increase circuit with the exception of splitting one current output equally (transistors Q 11 and Q 12) into two equal current source outputs for a multi-vibrator.

The increase circuit operates by reducing VL from its nominal value and the decrease circuit works by reducing Ich. Both these control mechanisms are needed because of the extremes of process variations and operating conditions, in addition to the limited control range of the these techniques (less than a factor of two for each control mechanism).

The circuit is powered from V$_{CC}$(+5 V) and V$_{EE}$(−3.25 V) with the emitter follower outputs biased with a resistor to ground, GND. The control input is differential and is attenuated and low pass filtered for increased mid-band noise rejection.

The increase circuit employs negative feedback to decrease the output swing, thereby increasing the oscillation frequency. The increase function is limited by the phase shift of the negative feedback. In other words, the delay in canceling the swing limits the degree to which the swing can be reduced.

The decrease circuit employs positive feedback to shift the current away from the multi-vibrator capacitor while maintaining a constant output swing. As the total multi-vibrator current in Q13 surpasses the value of the current in Q11+Q12, the multi-vibrator pair will no longer generate enough swing in R1 and R2 to cause the outputs, VO and VOB, to cross. When this occurs Q3 and Q4 no longer switch and the oscillator output is no longer useful. These controlling mechanisms each operate over slightly more than half the total control range overlapping a small amount at V$_{in}$=0 volts.

For V$_{in}$=F-FB=±1.6 volts control range, R$_1$=40Ω and R$_2$=700Ω have been chosen to allow access to the full control range over process variation and operating conditions. The collector current of Q13, for example, is approximately linear over the range 0≤V$_{in}$≤1.6 and the transconductance is given by ΔI$_{c13}$/ΔV$_{in}$≈−1/(R$_1$+R$_2$).

The performance of the VCO 606 was simulated for worst and best case process results and operating conditions. The simulated circuitry included the reference generator, VCO, and VCO buffer loading the outputs. Worst and best case models were used at 100° C. and 0° C. and the power supply was varied ±5%. The VCO simulations show an 11% margin for the two critical corners: large negative control input to slow down the best case operation to 640 MHz; and large positive control input to speed up the worst case operation to 640 MHz.

4.3. Delay Line PLL

Figure 8:
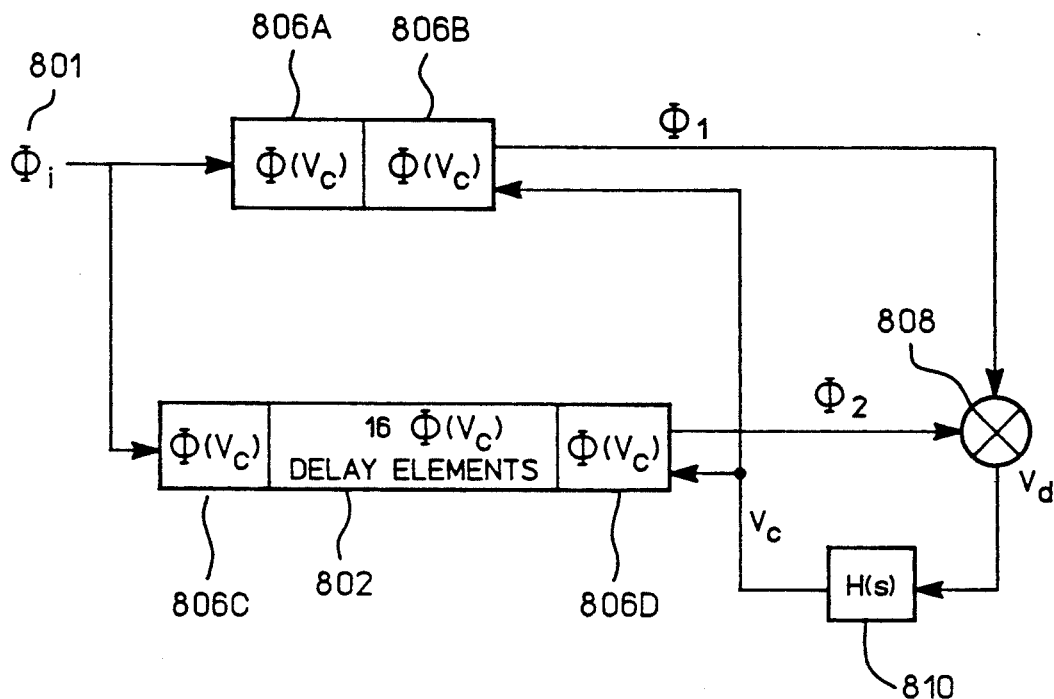
FIG. 8 illustrates a block diagram of a delay line phase-locked loop interpolator of the present invention.

The delay line PLL 512 is described in greater detail in this section. FIG. 8 illustrates the delay line PLL 512.

The PLL 512 includes delay cells 802, delay buffers 806, a phase detector 808, and a filter 810.

As shown in FIG. 8, the high frequency clock with phase 801 is input through two paths to a phase detector 808. The clock signal is input to a serial chain of 16 controllable delay elements 802 which is buffered by 1 delay cell 806C to allow the input rise time of the 16 delay cells to approximately match for each of the cells. To maintain the constant load impedance on the last cell 806D, another delay cell 806D is added.

The output delay of the chain is described by $\Phi_2 = 18K_cV_c + 18\Phi_c$ where $\Phi_c$ is a constant delay with zero input control voltage $V_c$ of a delay cell. This ignores the time delay of the output from the input delay control of up to 18 gate delays. Two matching cells 806A and 806B are similarly added to the input path to compensate for the effects of the added cells 806C and 806D in the delay chain. The last cell in each path drives the phase detector whose average output voltage $V_d = K_d(\Phi_1 - \Phi_2)$. This is in turn filtered to create the control voltage $V_c$. The constants $K_c$ and $K_d$ represent the DC gain of the loop filter and phase detector respectively.

By making the delay of each of the 16 elements of the delay chain an intereger multiple Y of 1/16th of the clock period, the output of the chain will be in phase with its input. Using only odd multiples, the outputs of the delay elements correspond to 16 phases of the clock. For mode Y=1, a 16 phase clock is shown in FIG. 9. Decoding of the clock phases is the next step.

The multiple Y determines the number of clock periods which exist within the delay chain. For Y=1, only one clock period exists in the chain and each of the delays is approximately 100 psec for a 640 MHz input. For realizable delay times allowing for process variation, Y=5 has been chosen for a nominal ≈500 psec element delay requiring five clock cycles to exist in the delay chain in the locked state to generate the 16 phases. In this mode of operation, the outputs of the successive cells of the chain must be interleaved to correctly decode the clock phase. The order of the effective 0-15 delays for the cells is respectively given as 0, 5, 10, 15, 4, 9, 14, 3, 8, 13, 2, 7, 12, 1, 6, 11, 0 in the delay chain. The delay cell range is guaranteed over process, temperature, and power variation to be able to lock the phase-lock loop for a clock frequency of 640 MHz.

The loop gain is $T(s) = 16K_cK_dH(s)$ where H(s) represents the frequency response of the loop filter 810. Since $K_c$ has high frequency effects only when concerned with delays of the order of the delay of the cascade of delay cells and $K_d$ is a constant, the stability characteristics are completely described by H(s) to within a constant gain factor if the gain of the loop <<1 when the frequency effect of $K_c$ becomes evident. Once the loop is within its linear range and locked, the system remains locked and thermal and noise variations in the circuit are reduced by the phase-locked loop's tracking capability. The bandwidth of the loop should be kept low to reduce the effects of noise and jitter while a single pole rolloff yields 90° of phase margin and excellent stability. This can be realized with a low pass filter or integrator where $H(s) = H_o/(\tau s + 1)$ for DC gain $H_o$ of the filter and $$\text{pole frequency} = \frac{1}{2\pi\tau}.$$

Figure 10:
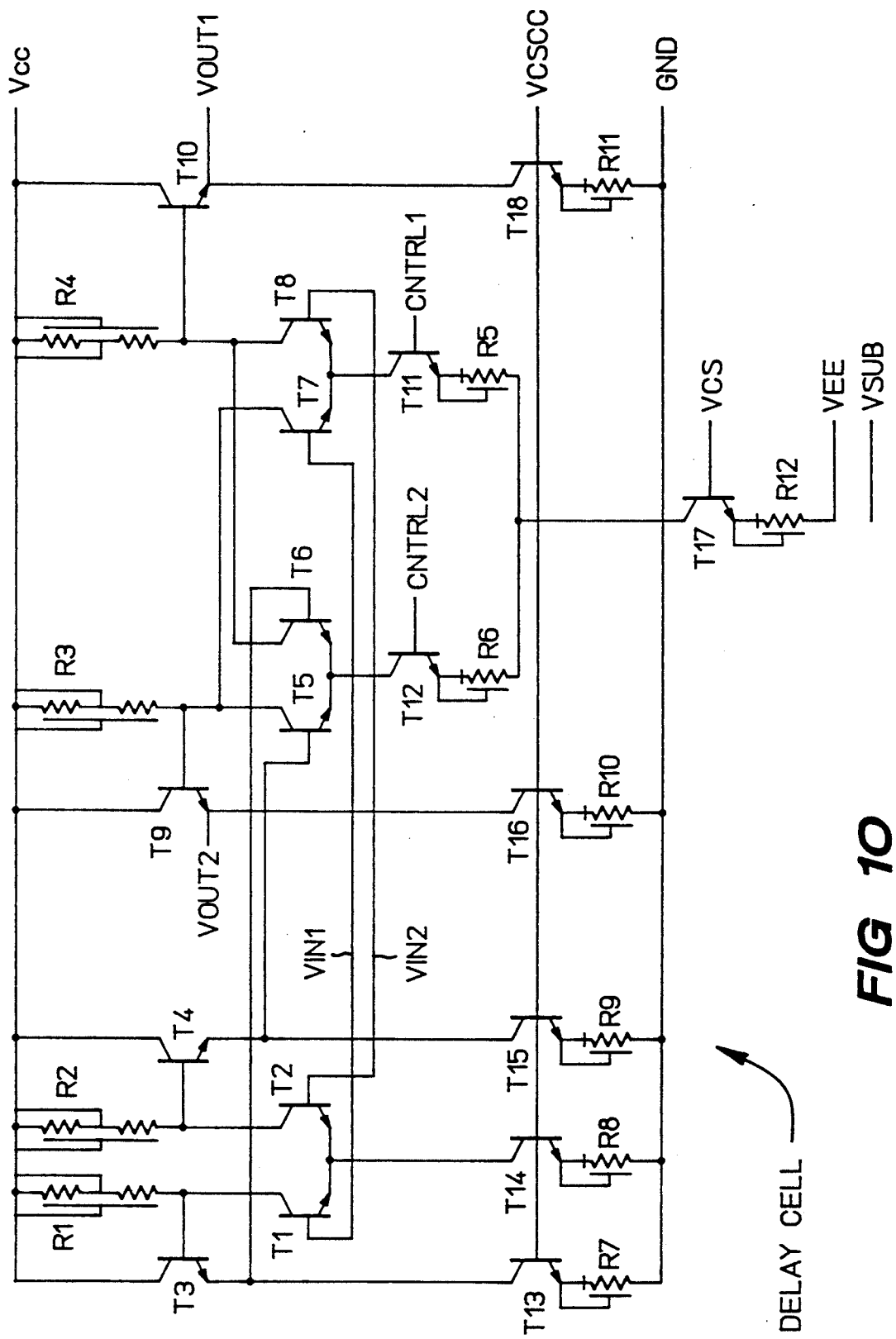
FIG. 10 illustrates a circuit diagram of a controllable delay cell of the present invention.

FIG. 10 illustrates an implementation of each of the delay cells 802, 806. The structure and operation of the delay cell implementation shown in FIG. 10 is well known to those skilled in the art. Other delay cells are available and may be interchanged for the cell of FIG. 10.

The circuit uses two gates of different time delay. In one case the input directly drives the output gate consisting of transistors T7-10, and T17 and resistors R3, R4, and R12. The second path for the signal is to travel through the gate consisting of transistors T1-4, and T14 and resistors R1, R2, and R8. The output of this gate drives an additional differential pair of inputs, transistors T5 and T6, to the first gate where the output is the weighted sum of the two differential pairs' bias currents.

Control is handled by a mixer using the differential transistor pair T11 and T12 and emitter degeneration resistors R5 and R6 and the control voltage $V_{cntrl1} - V_{cntrl2}$. The output voltage swing is thus held to a constant but the delay of the stage is variable depending on the delays of the two individual gates and the control voltage. The individual gate delays are determined by their bias currents and the load resistors. The emitter degeneration in the control voltage differential pair reduces the gain of the control voltage to the change in delay thus reducing the sensitivity to noise at the control voltage in producing output phase jitter as discussed later.

The delay cell is characterized by cascading six delay cells loaded by the latches for the two interpolator channels. The input clock is differentially buffered to drive the chain of delay cells. By varying the control voltage, the range in the delay of the cells can be graphed. A plot of the delay for nominal process values, temperature, and power is shown in FIG. 11.

Figure 11:
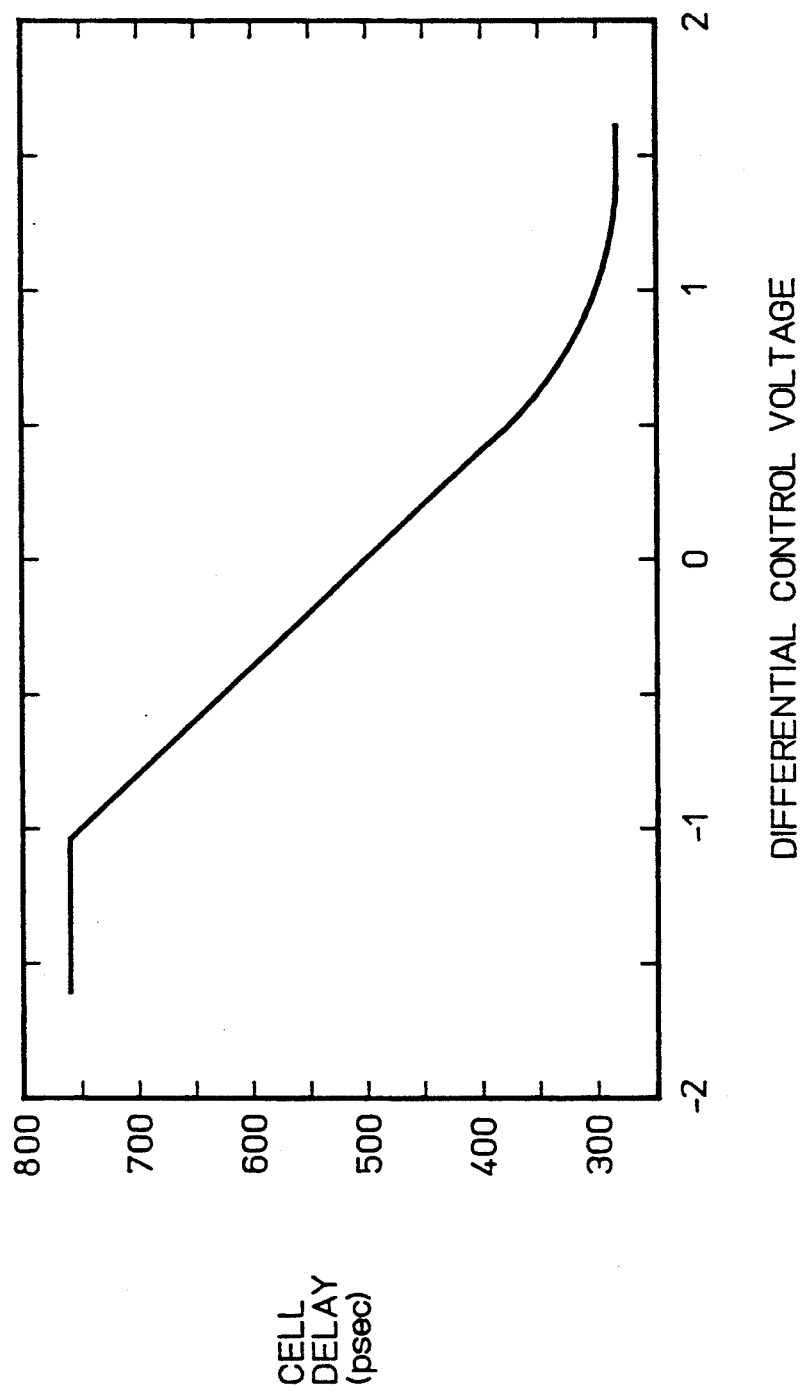
FIG. 11 illustrates a graph characterizing differential control voltage of a controllable delay cell.

In FIG. 11, the control range is shown to vary from ≈280 psec to 830 psec. The vertical bars represent the variation in the simulated cell delays which is attributed to the differences in input and output rise and fall times due to the differences in the driving buffer lmpedence and signal drive rippling through the delay cell chain 802. The variation is seen to be on the order of 15-20 pseconds. This does not take into account variation due to mismatch of the delay cell transistors and resistors.

As stated previously, the delay cell control range is dependent on the bias current, load resistors, and transistor parameters of each of the two gates comprising the cell which vary with process, temperature, and power supply variation. For high temperature, T=100° C., +5% power supply, and worst case process parameters, the low extreme of delay control voltage was 395 psec. The best case simulations for low temperature, T=0° C., +5% power supply, and best case process parameters yield the high extreme of delay control of 613 psec.

While various embodiments of the present invention have been described above, it should be understood that they have been presented by way of example only, and not limitation. Thus, the breadth and scope of the present invention should not be limited by any of the abovedescribed exemplary embodiments, but should be defined only in accordance with the following claims and their equivalents.

What is claimed is:

1. An apparatus for timing an event, comprising:
   a phase-locked loop for producing a high frequency signal phase-locked to a low frequency signal;
   an N-bit counter for counting edges of the high frequency signal to produce a count value, wherein the N-bit counter comprises means for generating a least significant bit of the count value;

a phase detector, coupled to the N-bit counter, for generating an output signal proportional to a phase difference between the low frequency signal and the least significant bit;

a voltage controlled oscillator, coupled to the phase detector, for producing the high frequency signal from the output signal; and an N-bit latch for latching the count value from the N-bit counter upon receiving the event.

2. The apparatus of claim 1, wherein said phase-locked loop further comprises a filter, coupled to the phase detector and the voltage controlled oscillator, for stabilizing the output signal.

3. The apparatus of claim 1, further comprising a synchronizer for synchronizing the event with the high frequency signal to produce a synchronized event.

4. The apparatus of claim 3, wherein the N-bit latch comprises means for latching the count value from the N-bit counter upon receiving the synchronized event.

5. An apparatus for timing an event, comprising:

a delay line phase-lock loop for phase locking a high frequency reference signal with a delayed high frequency signal, the delay line phase lock loop comprising means for generating multiple phases of the delayed high frequency signal; and an X-bit latch, coupled to said delay line phase-lock loop, for latching a state of each phase of the delayed high frequency signal upon receiving the event.

6. The apparatus of claim 5, wherein said delay line phase-lock loop further comprises:

an X-bit delay cell chain as a means for delaying the high frequency reference signal; and a phase detector, coupled to the X-bit delay cell chain, for phase locking the high frequency reference signal with the delayed high frequency signal.

7. The apparatus of claim 6, wherein the X-bit delay cell chain comprises multiple delay cells, each of the delay cells comprising:

means for delaying the high frequency reference signal; and means for storing a value for each phase of the delayed high frequency signal.

8. The apparatus of claim 7, further comprising a filter, coupled to the phase detector and the X-bit delay cell chain, for controlling the X-bit delay cell chain.

9. The apparatus of claim 8, further comprising a decoder, coupled to the X-bit latch, for decoding a latched state of each phase of the delayed high frequency reference signal from the X-bit latch to produce an interpolated timing value.

10. An apparatus for timing an event, comprising: a voltage controlled oscillator phase-locked loop for producing a high frequency signal in phase with a low frequency signal;

a delay line phase-lock loop comprising:

an X-bit delay cell chain for producing a delayed high frequency signal by delaying the high frequency signal;

means for generating multiple phases of the delayed high frequency signal; and means for phase locking the high frequency signal with the delayed high frequency signal; and at least one X-bit latch, coupled to the delay line phase-lock loop, for latching a state of each phase of the delayed high frequency signal upon receiving the event.

11. The apparatus of claim 10, further comprising a decoder, coupled to the X-bit latch, for decoding a latched state of each phase of the delayed high frequency signal from the X-bit latch to produce an interpolated value.

12. The apparatus of claim 11, further comprising at least one synchronizer for synchronizing the event with the high frequency signal.

13. The apparatus of claim 12, further comprising at least one pipeline data output device coupled to said decoder for out-putting the interpolated value upon receiving the synchronized event.

14. The apparatus of claim 10, wherein the delay line phase-lock loop further comprises a phase detector, coupled to the X-bit delay cell chain, for phase locking the high frequency signal with the delayed high frequency signal.

15. An apparatus for timing an event, comprising:

a phase-locked loop for producing a high frequency signal phase-locked to a low frequency signal, the phase-locked loop having an N-bit counter for counting edges of the high frequency signal to produce a count value;

an N-bit latch, coupled to the N-bit counter, for latching the count value from the N-bit counter upon receiving the event; and a synchronizer, coupled to the N-bit counter and the phase-locked loop, for synchronizing the event with the high frequency signal to produce a synchronized event.

16. The apparatus of claim 15, wherein the N-bit counter comprises means for generating a least significant bit of the count value.

17. The apparatus of claim 16, wherein said phase-locked loop comprises:

a phase detector, coupled to the N-bit counter, for generating an output signal proportional to a phase difference between the low frequency signal and the least significant bit; and a voltage controlled oscillator, coupled to the phase detector, for producing the high frequency signal from the output signal.

18. The apparatus of claim 15, wherein the N-bit latch comprises means for latching the count value from the N-bit counter upon receiving the synchronized event.

* * * * *